United States Patent
Milano et al.

(10) Patent No.: US 8,907,437 B2
(45) Date of Patent: Dec. 9, 2014

(54) REINFORCED ISOLATION FOR CURRENT SENSOR WITH MAGNETIC FIELD TRANSDUCER

(75) Inventors: Shaun D. Milano, Concord, NH (US); Weihua Chen, Westford, MA (US)

(73) Assignee: Allegro Microsystems, LLC, Worcester, MA (US)

( * ) Notice: Subject to any disclaimer, the term of this patent is extended or adjusted under 35 U.S.C. 154(b) by 330 days.

(21) Appl. No.: 13/188,739

(22) Filed: Jul. 22, 2011

(65) Prior Publication Data

US 2013/0020660 A1    Jan. 24, 2013

(51) Int. Cl.
H01L 31/103 (2006.01)
G01R 15/20 (2006.01)

(52) U.S. Cl.
CPC .................... G01R 15/207 (2013.01)
USPC ........... 257/422; 257/421; 257/427; 257/666; 257/676; 257/678; 257/737; 257/741; 257/778; 257/780; 257/782; 257/E27.005; 257/E29.323; 257/E23.01; 257/E23.052; 257/E23.116; 324/117 H; 324/117 R; 324/126; 324/127; 324/251; 338/32 R; 338/32 H; 338/49; 174/536

(58) Field of Classification Search
USPC ......... 257/421, 422, 427, 666, 676, 678, 737, 257/741, 773, 778–780, 782, 784, 787, 257/E27.005, E27.006, E29.323, E23.01, 257/E23.052, E23.116; 324/117 H, 117 R, 324/126, 127, 251, 252; 338/32 R, 32 H, 49; 174/536, 52.4

See application file for complete search history.

(56) References Cited

U.S. PATENT DOCUMENTS

| | | |
|---|---|---|
| 4,893,073 A | 1/1990 | McDonald et al. |
| 5,041,780 A | 8/1991 | Rippel |
| 5,124,642 A | 6/1992 | Marx |
| 5,247,202 A | 9/1993 | Popovic et al. |
| 5,615,075 A | 3/1997 | Kim |

(Continued)

FOREIGN PATENT DOCUMENTS

| | | |
|---|---|---|
| DE | 10 2008 034 577 A1 | 2/2010 |
| EP | 1 107 328 A2 | 6/2001 |

(Continued)

OTHER PUBLICATIONS

Notification of Transmittal of the International Search Report and The Written Opinion or the International Searching Authority, or the Declaration, PCT/US2012/046025, dated Nov. 27, 2012, 1 page.

(Continued)

*Primary Examiner* — Meiya Li
(74) *Attorney, Agent, or Firm* — Daly, Crowley, Mofford & Durkee, LLP

(57) ABSTRACT

A current sensor packaged in an integrated circuit package to include a magnetic field sensing circuit, a current conductor and an insulator that meets the safety isolation requirements for reinforced insulation under the UL 60950-1 Standard is presented. The insulator is provided as an insulation structure having at least two layers of thin sheet material. The insulation structure is dimensioned so that plastic material forming a molded plastic body of the package provides a reinforced insulation. According to one embodiment, the insulation structure has two layers of insulating tape. Each insulating tape layer includes a polyimide film and adhesive. The insulation structure and the molded plastic body can be constructed to achieve at least a 500 VRMS working voltage rating.

21 Claims, 10 Drawing Sheets

(56) References Cited

U.S. PATENT DOCUMENTS

| | | | |
|---|---|---|---|
| 6,005,383 | A | 12/1999 | Savary et al. |
| 6,252,389 | B1 | 6/2001 | Baba et al. |
| 6,356,068 | B1 | 3/2002 | Steiner et al. |
| 6,462,531 | B1 | 10/2002 | Ohtsuka |
| 6,545,456 | B1 | 4/2003 | Radosevich et al. |
| 6,683,448 | B1 | 1/2004 | Ohtsuka |
| 6,727,683 | B2 | 4/2004 | Goto et al. |
| 6,995,315 | B2 | 2/2006 | Sharma et al. |
| 7,075,287 | B1 | 7/2006 | Mangtani et al. |
| 7,166,807 | B2 | 1/2007 | Gagnon et al. |
| 7,358,724 | B2 | 4/2008 | Taylor et al. |
| 7,709,754 | B2 | 5/2010 | Doogue et al. |
| 7,768,083 | B2 | 8/2010 | Doogue et al. |
| 2004/0056647 | A1 | 3/2004 | Stauth et al. |
| 2004/0080308 | A1 | 4/2004 | Goto |
| 2004/0113280 | A1* | 6/2004 | Kim .............................. 257/777 |
| 2004/0155644 | A1 | 8/2004 | Stauth et al. |
| 2005/0045359 | A1 | 3/2005 | Doogue et al. |
| 2006/0002147 | A1 | 1/2006 | Hong et al. |
| 2006/0219436 | A1 | 10/2006 | Taylor et al. |
| 2007/0170533 | A1* | 7/2007 | Doogue et al. ................. 257/422 |
| 2009/0206833 | A1 | 8/2009 | Imai et al. |
| 2010/0156394 | A1 | 6/2010 | Ausserlechner et al. |
| 2011/0221429 | A1 | 9/2011 | Tamura |

FOREIGN PATENT DOCUMENTS

| | | |
|---|---|---|
| EP | 1 111 693 A2 | 6/2001 |
| EP | 1 107 327 A2 | 8/2001 |
| EP | 1 111 693 A2 | 8/2001 |
| JP | 61-71649 | 4/1986 |
| JP | 4-364472 | 12/1992 |
| WO | WO 99/14605 | 3/1999 |

OTHER PUBLICATIONS

International Search Report, PCT/US2012/046025, dated Nov. 27, 2012, 3 pages.

Written Opinion of the International Searching Authority, PCT/US2012/046025, dated Nov. 27, 2012, 7 pages.

Steiner, et al., "Fully Packaged CMOS Current Monitor Using Lead-on-Chip Technology," Physical Electronics Laboraotry, ETH Zurich, CH8093 Zurich, Switzerland, 0-7803-4412-X98; IEEE 1998; pp. 603-608.

PCT Search Report and Written Opinion of the ISA for PCT/US2004/009908 dated Aug. 16, 2004, 14 pages.

Allegro Datasheet ACS712, Fully Integrated, Hall Effect-Based Linear Current Sensor IC with 2.1 kVRMS Isolation and a Low-Resistance Current Conductor, 2006-2010, 14, pages.

Allegro Datasheet ACS758xCB, Thermally Enhanced, Fully Integrated, Hall Effect-Based Linear Current Sensor IC with 100 μΩ Current Conductor, 2008-2010, 19 pages.

Underwriters Laboratories Inc. (UL), UL Standard for Safety for Information Technology Equipment—Safety—Part 1: General Requirements, UL 60950-1, Second Edition, dated Mar. 27, 2007, 510 pages.

Extended EP Search Report dated Dec. 7, 2011 for EP Application No. 09000122.3, filed Jan. 8, 2009, 6 pages.

Office Action dated Aug. 23, 2012 for EP Application No. 09000122. 3, filed Jan. 8, 2009, 4 pages.

Response to Office Action filed Dec. 18, 2012 for EP Application No. 09000122.3, filed Jan. 8, 2009, 39 pages.

EP Intention Grant dated Sep. 30, 2013 for EP Application No. 09000122.3, filed Jan. 8, 2009, 7 pages.

Letter from JP Associate translating Office Action dated Jun. 21, 2011 for JP Application No. 2010-281774, filed Dec. 17, 2010, 2 pages.

Letter to JP Associate dated Jul. 6, 2011, re filing response, for JP Application No. 2010-281774, filed Dec. 17, 2010, 3 pages.

Letter from FA with Response dated Aug. 18, 2011, for JP Application No. 2010-281774, filed Dec. 17, 2010, 5 pages.

Translation of Office Action dated Feb. 6, 2012, for JP Application No. 2010-281774, filed Dec. 17, 2010, 2 pages.

Letter to JP Associate dated Feb. 16, 2012 re filing response, for JP Application No. 2010-281774, filed Dec. 17, 2010, 3 pages.

Translation of Office Action dated Sep. 20, 2012, for JP Application No. 2010-281774, filed Dec. 17, 2010, 2 pages.

Letter from JP Associate with Response dated Dec. 20, 2012, for JP Application No. 2010-281774, filed Dec. 17, 2010, 9 pages.

Notice of Allowance dated Apr. 2, 2013, for JP Application No. 2010-281774, filed Dec. 17, 2010, 3 pages.

Letter from JP Associate with Original JP Grant, issued Apr. 26, 2013, for JP Application No. 2010-281774, filed Dec. 17, 2010, 5 pages.

Notification Transmittal of International Preliminary Report on Patentability dated Feb. 6, 2014 for Application No. PCT/US2012/046025, filed Jul. 10, 2012.

* cited by examiner

REINFORCED ISOLATION FOR CURRENT SENSOR WITH MAGNETIC FIELD TRANSDUCER

CROSS-REFERENCE TO RELATED APPLICATIONS

Not applicable.

STATEMENT REGARDING FEDERALLY SPONSORED RESEARCH

Not applicable.

FIELD OF THE INVENTION

This invention relates generally to integrated circuit (IC) current sensors that contain magnetic field sensing elements and current conductors, and more particularly, to safety isolation approaches for such current sensors.

BACKGROUND

Safety isolation is an important consideration in the design of any electrical product that can expose its users to potentially hazardous voltage levels. Manufacturers of such products need to ensure that their products are designed to adequately safe-guard against electrical shock.

In any safety isolation scheme, there is a certain amount of insulation required to create a protective isolation barrier between primary and secondary circuits. A primary circuit is a circuit that is directly connected to line voltage and therefore clearly has the potential to reach hazardous voltage levels. A secondary circuit is not electrically connected to the primary circuit (that is, there is no conductive connection between the secondary circuit and primary circuit) but could experience hazardous voltage levels if insulation fails.

Underwriters Laboratories Inc. (UL) has developed a safety standard called UL 60950-1 (second edition), which specifies a high level of safety isolation to protect against risk of injury due to electric shock. The UL 60950-1 standard is based on the International Electrotechnical Commission (IEC) standard, IEC 60950-1 (second edition). The UL 60950-1 standard defines five categories of insulation: functional insulation; basic insulation; supplemental insulation; double insulation; and reinforced insulation. Functional insulation does not protect against electrical shock. Basic insulation is a single level of insulation that provides basic protection against electric shock. Supplemental insulation is independent insulation that can be applied in addition to basic insulation to reduce the risk of electrical shock in the event of a failure of the basic insulation. Double insulation comprises both basic insulation and supplemental insulation. Thus, basic insulation provides a single layer of insulating barrier between primary and secondary circuits, whereas double insulation provides two layers of insulating barrier between primary and secondary circuits. Reinforced insulation is a single insulation system that provides electrical shock protection equivalent to double insulation.

If a secondary circuit is not user-accessible, a basic level of isolation protection, that is, basic insulation, may be acceptable. Safety needs for products that include user-accessible secondary circuits, on the other hand, demand two levels of protection provided by double insulation or its equivalent in reinforced insulation.

Although the UL 60950-1 standard is intended for use with information technology equipment, it has been adopted for many other products and is considered the premier standard for product designs that require galvanic isolation. One product that requires galvanic isolation is the current sensor. Some current sensors use a magnetic field transducer (for example, a Hall effect or magnetoresistive transducer) in proximity to a current conductor. The magnetic field transducer generates an output signal having a magnitude proportional to the magnetic field induced by a current that flows through the current conductor.

The magnetic field transducer is sometimes provided as an integrated circuit (IC) in an IC package that also contains a current conductor. Illustrative current sensors of this type are sold under part numbers ACS712 and ACS758xCB by Allegro MicroSystems, Inc. of Worcester, Mass. 01615, the Assignee of the subject application.

Various parameters characterize the performance of such current sensors, including sensitivity. Sensitivity is related to the magnitude of a change in output voltage from the magnetic field transducer in response to a sensed current. The sensitivity of a current sensor is related to a variety of factors. One important factor is the physical separation between the magnetic field transducer and the current conductor. Integration of the current conductor into an IC package allows for close and precise positioning of the current conductor relative to the magnetic field transducer.

At present, to meet the more stringent requirements for double or reinforced insulation, applications that use such integrated circuit current sensors rely on basic insulation provided by the current sensor's package assembly, e.g., molding plastic or other insulation, in conjunction with an external, supplemental level of insulation provided by the use of a discrete opto-isolator or similar device.

SUMMARY

In general, in one aspect, the invention is directed to a current sensor. The current sensor includes a lead frame having a first portion comprising current leads connected to form a current conductor to carry a primary current and a second portion comprising signal leads. The current sensor further includes a die, coupled to the second lead frame portion by an interconnect. The die provides a magnetic field sensing circuit to sense a magnetic field associated with the primary current and produce an output at one of the signal leads, based on the sensed magnetic field. Also included in the current sensor is an insulation structure and plastic material. The insulation structure is disposed between the current conductor and the die, and includes a first insulation layer and a second insulation layer. Each of the first and second insulation layers includes a thin sheet material. The plastic material surrounds the die, the interconnect and at least a portion of the lead frame to form a molded package body. The insulation structure is dimensioned so that the plastic material provides a reinforced insulation.

Embodiments of the invention may include one or more of the following features. The thin sheet material can be a polyimide film. Each of the first and second insulation layers can further include a layer of adhesive. The polyimide film and the adhesive layer can be provided in a tape. The thickness of the polyimide or other thin sheet material can be sufficient to meet a minimum working voltage rating of 500 VRMS under UL 60950-1, e.g., approximately 25 microns. The polyimide film can have an insulating property and thickness that enables the polyimide film to withstand an isolation voltage of at least 7000 kV. The magnetic field sensing circuit can include a magnetic field transducer having a sensing element such as a Hall-effect sensing element or a magnetoresistive sensing element. The coupling of the die to the second lead frame portion can be that of a flip chip assembly or, alternatively, a die-up assembly. The insulation structure can cover at least a portion of the current conductor and extend laterally beyond a periphery of such portion by a distance required for the molded plastic material as a single layer insulation to achieve a reinforced insulation rating under UL 60950-1. The plastic material can include a molding compound classified as a group II material under UL 60950-1. The package body can be dimensioned to meet creepage and clearance requirements under UL 60950-1.

BRIEF DESCRIPTION OF THE DRAWINGS

The foregoing features of the invention, as well as the invention itself may be more fully understood from the following detailed description of the drawings, in which.

DETAILED DESCRIPTION

Figure 1A:
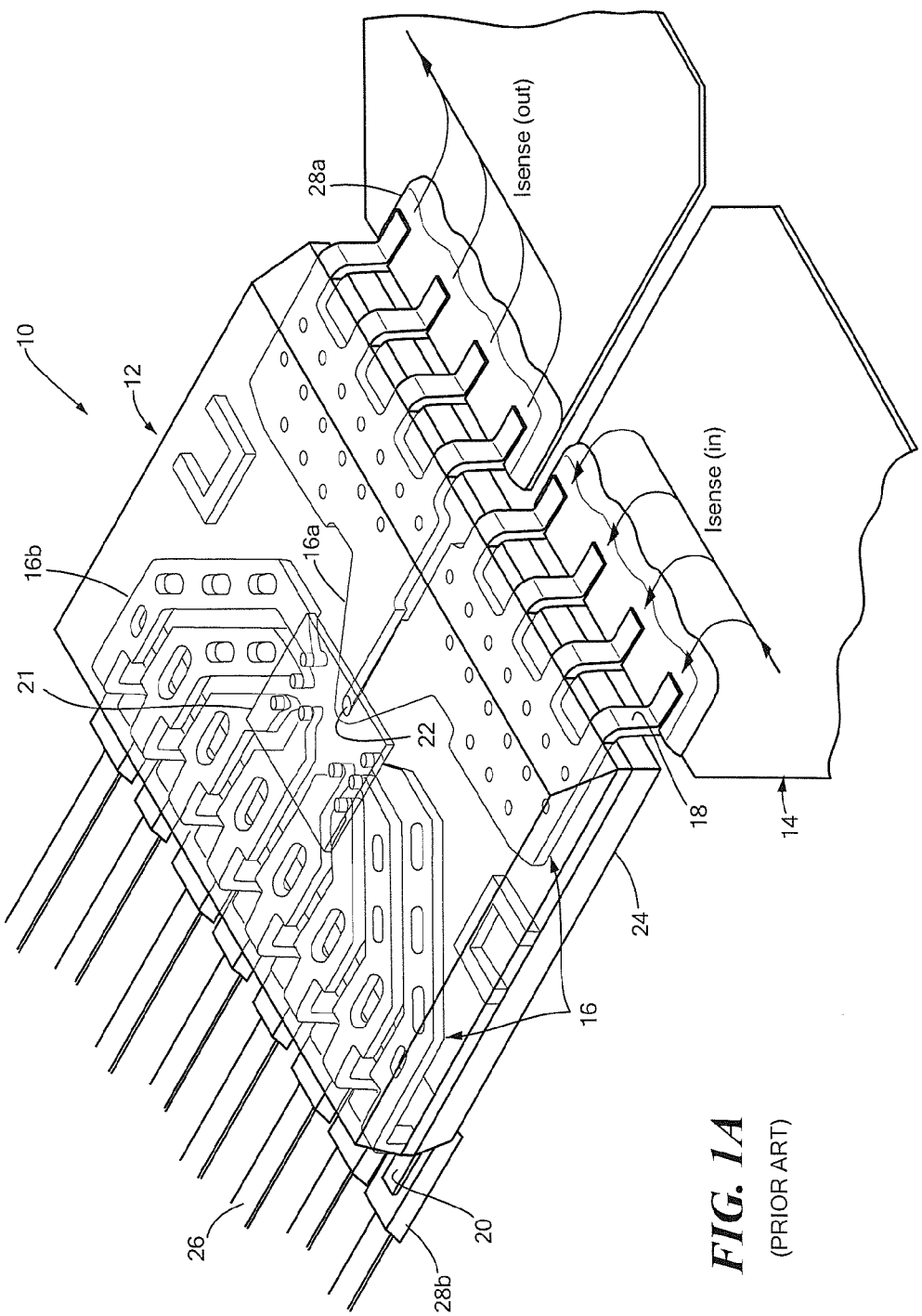
FIG. 1A shows a perspective view of a prior art current sensor with an integrated current path coupled to an external current conductor in a current sensing configuration.

A current sensor having an internal insulator or insulation structure that is compliant to requirements of Underwriters Laboratories Inc. (UL) Standard UL 60950-1, Second Edition (hereinafter "UL 60950-1" or "the Standard"), for reinforced insulation is presented herein. Embodiments of the current sensor design can achieve reinforced isolation in a single package system with a minimal footprint, for example, a surface mount, small outline integrated circuit (SOIC) package, for working voltages as high as 500 VRMS, as will be described.

Before describing details of the current sensor and its insulation structure, it may be helpful to explain some of the Standard's specification terms, insulation requirements and testing procedures.

First, the Standard describes four types or levels of insulating barrier protection: basic insulation; supplemental insulation; double insulation; and reinforced insulation. The definition of these terms are provided in Section 1.2.9 of the Standard, and described above in the Background.

The Standard does not specify a minimum thickness through insulation for basic insulation. For insulation to be considered supplemental or reinforced under the Standard, however, the insulation must have a minimum thickness of 0.4 mm. Insulation in the form of a thin sheet material, e.g., "thin film" material, may be used for supplemental and reinforced insulation, irrespective of its thickness, provided that at least two layers of such material are used. Requirements for thin sheet materials are discussed in Section 2.10.5 of the Standard.

Other terms of importance relate to the isolation voltage of a particular component or package. The terms "working voltage", "RMS working voltage", "peak working voltage", and "required withstand voltage", all defined in Section 1 of the Standard, will be discussed briefly.

The term "working voltage" refers to the highest voltage level that an insulation under consideration can be subjected to when a device such as a current sensor is operating under normal use. Normally, the working voltage is the line voltage and varies by country. For example, the working voltage is approximately 120 VRMS in the U.S.A. and 240 VRMS in Europe for phase to neutral applications, or 240 VRMS in the U.S.A. and 480 VRMS in Europe for line to line applications. The device must pass certain tests outlined in the Standard to achieve a particular working voltage rating. A very useful working voltage rating is 500 VRMS. A device that has been certified with a 500 VRMS working voltage rating could be used in many applications all over the world.

The term "RMS working voltage" refers to the RMS value of the working voltage, including any DC component, and is often used interchangeably with "working voltage".

The term "peak working voltage" refers to the peak value of the working voltage, including any DC component or any repetitive peak impulses generated by the device. This voltage is often specified as the peak or DC voltage. If the device has to withstand 120 VRMS then the peak working voltage would be 1.414*120 VRMS or 170 VPeak. If the device is rated to 170 VPeak, it could run at 170 VDC.

The term "required withstand voltage" refers to the peak voltage that the insulation under consideration is required to withstand. This voltage is also known as the isolation voltage. The required withstand voltage is very important as it will determine the working voltage rating the device will achieve per the testing requirements of the Standard. The required withstand voltage is usually much higher, e.g., in the range of 3000 to 4800 VRMS. The device does not need to operate continuously at this voltage. It need only survive this voltage for 60 seconds.

Testing according to procedures set forth in the Standard determine a device's working voltage and, therefore, the line voltage that can be applied to the device. For example, a current sensor can attain a working voltage rating, which ensures it can connect to a particular line voltage, e.g., a line voltage of 120, 240, or 480 VRMS, depending on how it is constructed and how well it performs relative to the requirements of the Standard.

Current sensors with integrated current conductors and magnetic field transducers have a primary conductor (i.e., the current conductor, which has leads connected to a high line voltage via an external current conductor) in close proximity to a secondary conductor (i.e., the lower voltage sensing circuits and signal pins). In applications where the device's primary conductor is connected to line voltages (e.g., 120, 240 or 480 VRMS), maintaining galvanic isolation between the primary and secondary conductors is important.

Some prior Hall-effect current sensors are designed to provide a galvanic isolation and, moreover, basic insulation, between the current conductor (which, as mentioned above, connects to line voltage and can be considered a primary conductor or circuit) and other conductive parts of the device that are electrically independent of the primary conductor (e.g., sensing circuits, interconnections and signal pins, which may be considered a secondary conductor or circuit), in the way they are constructed. An example of such a construction is illustrated in FIGS. 1A-1B.

Figure 1B:
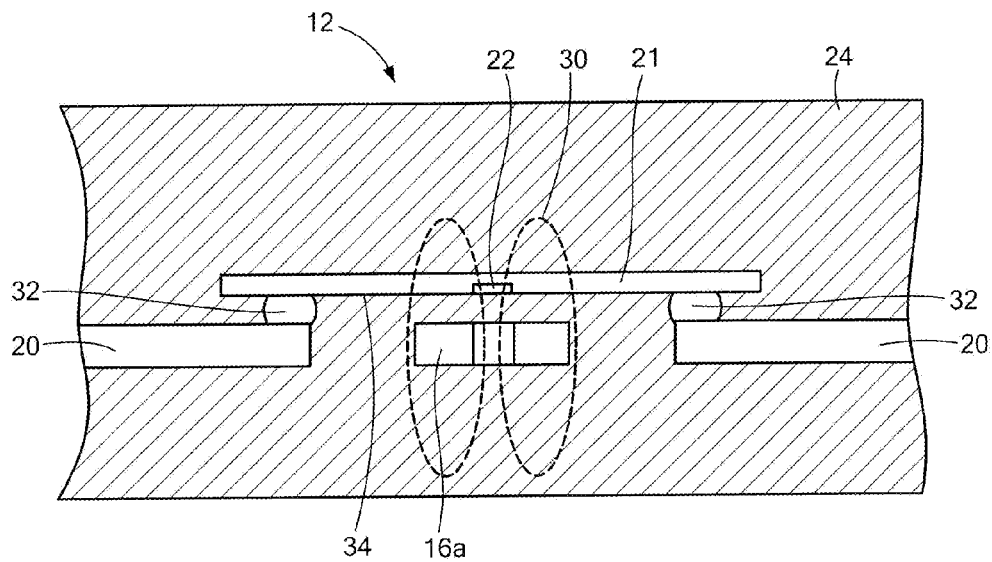
FIG. 1B shows a partial, cross-sectional view of the current sensor of FIG. 1A.

Referring to FIG. 1A, an exemplary current sensing configuration 10 includes a current sensor 12 coupled to a current conductor 14. The current conductor may be, for example, a printed circuit board (PCB) trace or layer, as shown, or a bus bar. Current flows in and out of the current sensor 12 through the external current path provided by the current conductor 14. The figure provides a "phantom" view, that is, one which reveals the internal structure of the current sensor 12. As can be seen in this view, the current sensor 12 includes a lead frame 16 having a first portion 16a that serves as an internal current path or conductor and includes primary current leads 18, and a second lead frame portion 16b that includes signal leads 20. The integrated current conductor 16a connects to a line voltage (via the external conductor 14). Therefore, the integrated current conductor 16a is part of a primary circuit and may be referred to as a primary conductor. The current sensor 12 also includes an integrated circuit (IC) die 21 having at least one magnetic field transducer or sensing element 22, e.g., a Hall effect element, and interface circuitry (not shown) of a magnetic field sensor provided therein. The die 21 is disposed above the lead frame 16 so that the sensing element 22 is proximate to the internal current conductor 16a, a portion of which is located underneath the die 21. That portion is shaped so that current flowing through the current conductor 16a passes near the transducer 22. The die 21 is mounted or coupled to the second lead frame portion 16b. The die and a portion of the lead frame are encapsulated in plastic material 24. The integrated current conductor leads 18 are coupled to the current conductor 14 and the signal leads 20 are coupled to PCB signal lines 26 via solder pads 28a and solder pads 28b, respectively.

The illustrated package style is an SOIC. A current sensor having an integrated current conductor and sensor die (like die 21), packaged together in an single package, for example, a surface mount IC package such as the SOIC, is referred to herein as an IC current sensor or, simply, a current sensor.

In the current sensing configuration, a current to be measured by the current sensor 12, labeled "Isense", is applied to the current conductor 14. The current flows through the current conductor into those of leads 18 that are used as input pins (shown to be electrically coupled in parallel), through a loop portion, and out of those of leads 18 that are used as output pins (also electrically coupled in parallel, as shown). The Isense current travels in and out of the current sensor 12 on the primary side of the device and is referred to as the "primary current".

FIG. 1B shows a cross-sectional view of a portion of the current sensor 12. The cross-section is taken through the magnetic field transducer 22, and is viewed from the primary side of the device. As can be seen in this view, the die 21 is positioned over, but does not come in contact with, the current conductor 16a. Also shown are the transducer 22 as well as the portion of the internal current conductor 16a that passes near (and is sensed by) the transducer 22. Magnetic flux lines associated with the magnetic field generated by the primary current flowing through the current conductor 16a are indicated by reference numeral 30.

In operation, when a primary current is flowing through the current conductor 16a, the transducer 22 converts the sensed magnetic field into a proportional voltage. An output based on that voltage is made available at one of the signal leads 20.

In the illustrated construction of FIGS. 1A-1B, the die 21 is attached to the signal leads 20 of the second lead frame portion 16b via an interconnect 32 shown as solder bumps. The solder bumps may be formed on a top or active surface of the die, surface 34. To attach the die to the lead frame in the illustrated arrangement, the die 21 is literally "flipped over" so that the die is face down, that is, its top surface 34 is facing downward (facing the direction of the current conductor 16a, in this example). This type of arrangement, in which a die is oriented face down for interconnection (e.g., to a lead frame, as shown, or substrate, circuit board, and so forth), is known as a "flip chip" assembly or configuration. The interconnect 32 can be a solder bump or other type of structure, such as a solder plated (or capped) copper pillar, formed on the die. When the die is flipped over, the bumps come to rest on sites on the lead frame. The interconnect could be provided in the form of solder bumps or paste placed onto the lead frame (prior to flipping the die thereon). A joint is formed between the bump (or die structure) and the lead frame during assembly processing. The die 21, lead frame signal leads 20 and interconnect (e.g., solder bumps) 32 together form a secondary circuit or conductor, as it is not connected to the line voltage and is electrically independent of the primary circuit/conductor (that is, the current conductor 16a). Points on the die, the signal leads and interconnect all may be considered and referred to as secondary contacts, connections or conductive parts of the current sensor.

In the current sensor design of FIGS. 1A and 1B, the space or "standoff" that is created between the die (secondary conductor) and the current conductor 16a (primary conductor) in the flip-chip assembly is filled with a transfer mold plastic, i.e., the plastic material 24, that has insulation properties. Thus, this type of current sensor construction has galvanic (primary to secondary) isolation and the plastic material performs as a basic insulation.

The insulation properties of the plastic material determine how much voltage can be applied to the primary current leads 18 before the insulation barrier breaks down and fails. Typically, a high voltage on the primary side of the device causes dendrite growth through the insulation, which results in the formation of a low resistance path from line voltage to the secondary side. In some applications, the secondary signal leads of the sensor are connected to user-accessible circuitry, for example, a microprocessor, with no insulating properties, thus exposing the user to risk of harm due to electric shock when this type of failure mechanism occurs. In such applications, a redundant level of protection in the form of a second or supplemental layer or level of insulation is needed.

Although the illustrated current sensor 12 has only a plastic material for insulation between the die and current conductor, it should be noted that some prior current sensors employ a layer of underfill material or have a insulating tape between die and current conductor. Examples of such devices are described in U.S. Pat. No. 6,356,068 and U.S. Pat. No. 7,075,287 (the latter being assigned to Allegro Microsystems, Inc., Assignee of the subject application). Such designs (including the one illustrated in FIGS. 1A-1B) do not achieve more than a basic level of insulation.

Figure 2:
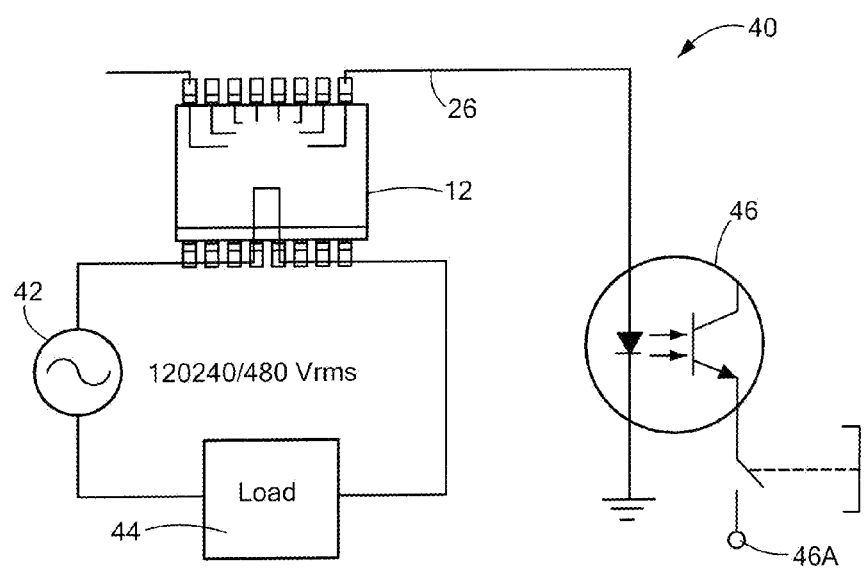
FIG. 2 shows a circuit diagram of a prior art current sensing application that employs a current sensor of the type depicted in FIGS. 1A-1B and utilizes the current sensor package in conjunction with opto-isolators to achieve double isolation for the application.

Referring to FIG. 2, an example of an application circuit 40 that employs the current sensor 12 and has two levels of isolation is shown. The current sensor 12 is connected in series with a line voltage source 42 (to provide a line voltage in the range of 120 to 480 VRMS) and a load 44. The primary current flows through the current sensor 12 as illustrated in FIGS. 1A-1B (that is, through the integrated current conductor), powers the load 44 and then returns to the line neutral. Each of the PCB signal lead lines 26 (which are coupled to the signal leads of the current sensor 12) is fed through an opto-isolator 46 so that a user can safely access circuitry (not shown) connected to the isolated side 46a of the opto-isolator 46. The opto-isolator 46 is represented schematically here as containing a light-emitting diode and phototransistor separated by a dielectric barrier.

Safety protection provided by basic insulation is available at the secondary leads, as the secondary and primary circuits are isolated from each other through the package's molding material (or, if a basic layer of insulation such as a single tape or polyimide layer is used, then through one of these two insulators at any secondary contact point). If an opto-isolator such as opto-isolator 46 (or some other insulating component) is connected to the current sensor's signal leads as a second or supplementary insulation, then a double insulation design is achieved. Note that a single system can provide the protection of double insulation and that the circuit 40 of FIG. 2 can be viewed as a single system.

According to the present invention, and as will be described in detail below, a level of reinforced isolation can be achieved in a single integrated package by incorporating into an integrated circuit current sensor an insulator that is constructed to meet the Standard's requirements for reinforced insulation. Advantageously, with the inclusion of such an insulator in an IC current sensor, external supplemental insulation, e.g., costly external components like opto-isolators (as shown in FIG. 2), can be eliminated from the board-level design.

Figure 3A:
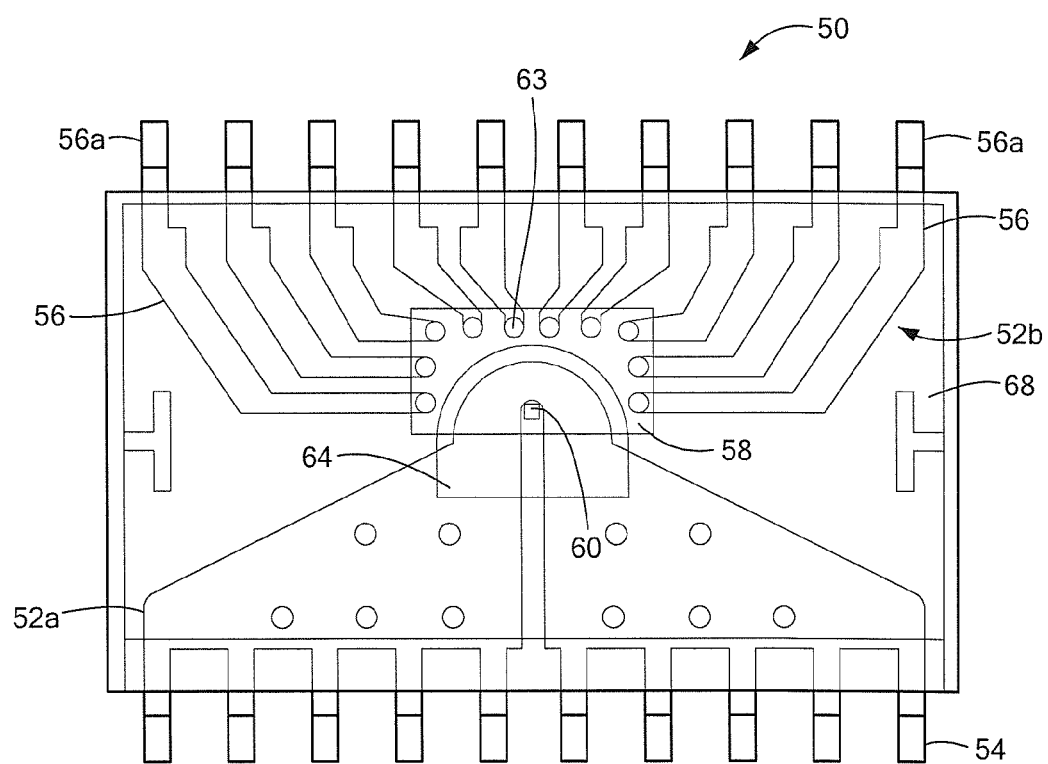
FIGS. 3A-3C show an example construction of a current sensor with an integrated current path that includes an insulation structure for reinforced isolation.
Figure 3B:
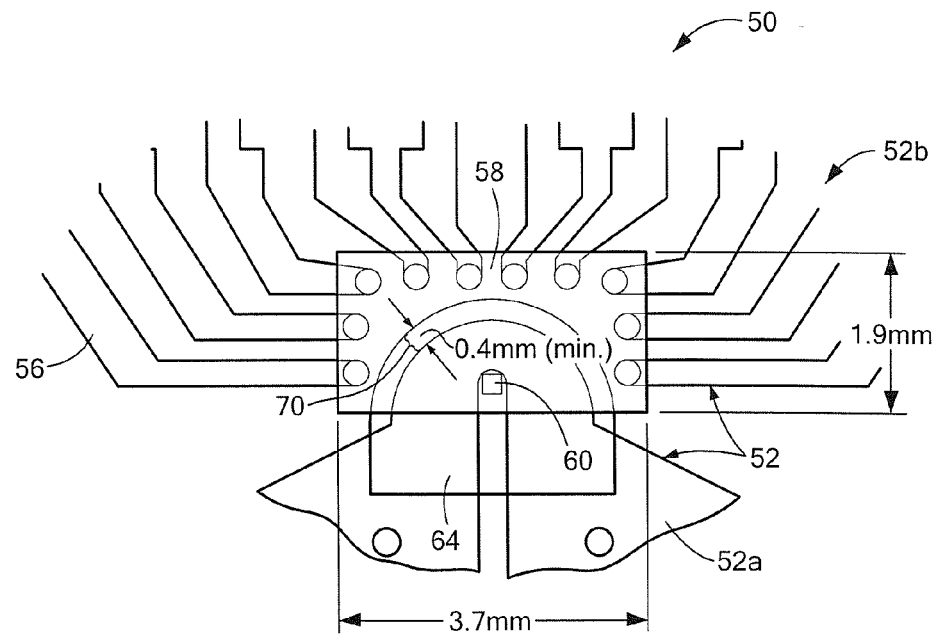
Figure 3C:
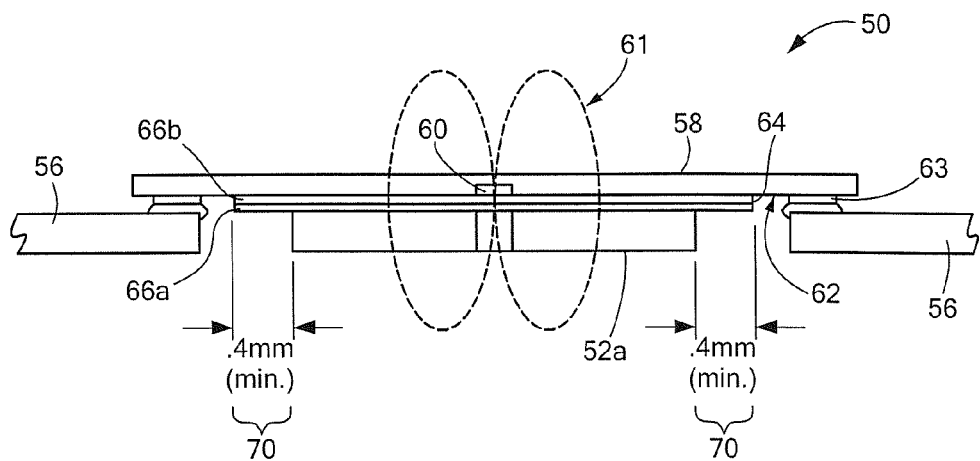
Figure 4A:
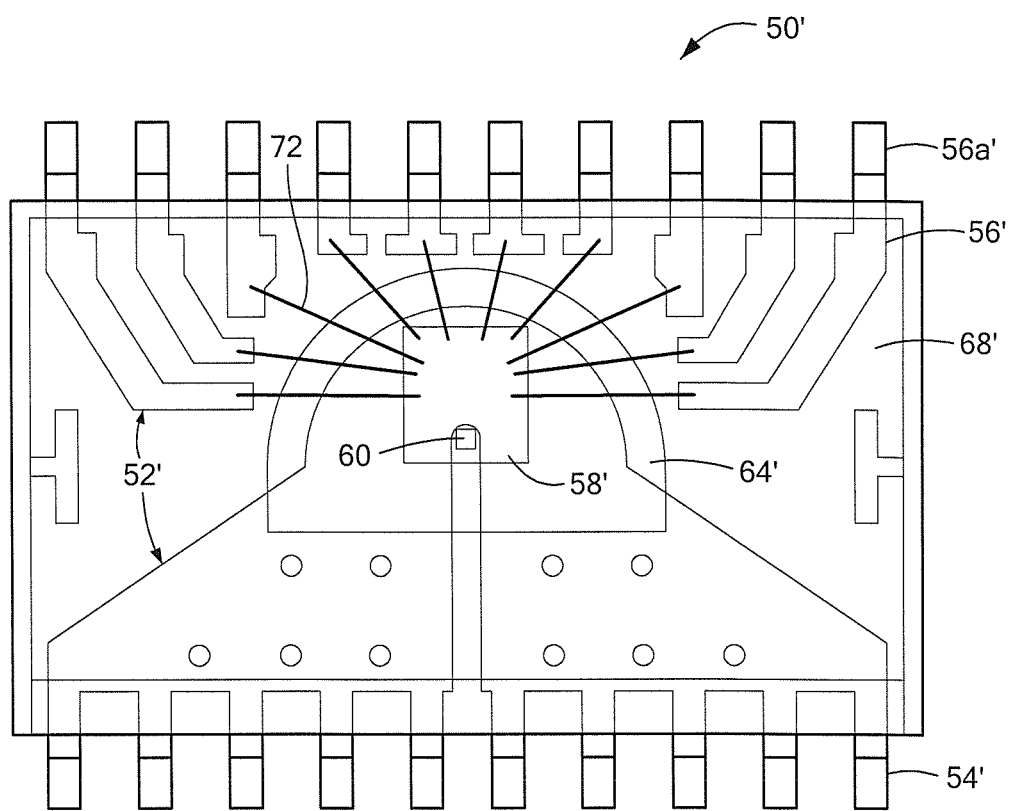
FIGS. 4A-4C show an alternative example construction of a current sensor with an integrated current path, that includes an insulation structure for reinforced isolation.
Figure 4B:
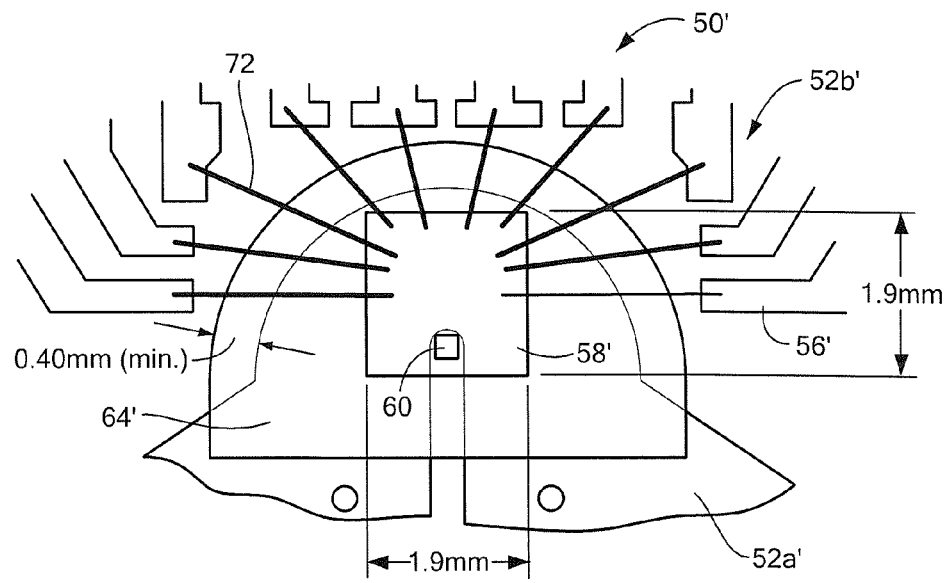
Figure 4C:
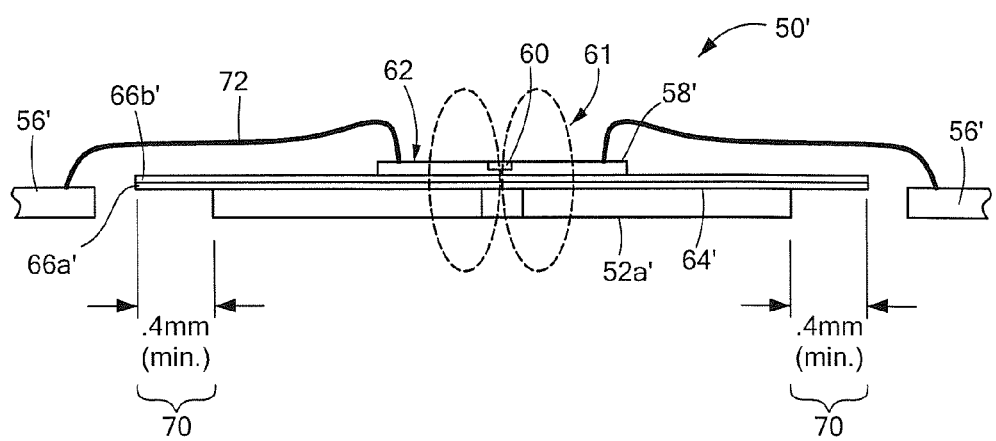

A current sensor with an integrated current conductor and further including an insulation structure for reinforced isolation will now be described. The insulation structure is applicable to different types of fully integrated current sensor assemblies. For example, and as illustrated in FIGS. 3A-3C, the insulation structure may be used with a flip chip assembly (as was described earlier with reference to FIGS. 1A-1B). As another example, and as illustrated in FIGS. 4A-4C, the insulation structure may be used with a "die up" assembly.

Turning first to FIGS. 3A-3C, a current sensor 50 in an SOIC package with a flip chip assembly is shown. FIGS. 3A and 3B show a "phantom" plan view and FIG. 3C a cross-sectional side view of a portion of the current sensor 50. As can be seen in FIG. 3A, the current sensor 50 has a lead frame 52 with a first portion 52a and a second portion 52b. The first portion 52a provides a current conductor with primary current leads or pins 54 and the second portion 52b provides signal leads 56, external portions of those leads being indicated as corresponding signal leads or pins 56a. Some of the primary current leads 54 are input current leads and the others are primary current output leads. The current sensor 50 includes a die 58 that contains a magnetic field sensing circuit with magnetic field transducer 60 (and circuitry not shown). The magnetic field sensing circuit is an integrated circuit. Magnetic flux lines associated with the magnetic field generated by the primary current in the current conductor 52a is indicated by reference numeral 61. The die 58 is flipped (with a top or active surface 62 facing down) and makes contact with the second portion 52b of the lead frame, that is, the internal signal leads 56, through an interconnect 63 shown here as solder plated copper pillars. Other suitable types of bumps or like structures could be used instead of the solder plated copper pillars.

Disposed between the die and the current conductor 52a is an insulation structure 64. The insulation structure 64 may be formed on or applied to the current conductor 52a and the IC die 58 placed on top of the insulation-covered current conductor, according to one possible assembly technique. The insulation structure 64 is formed by two layers of insulating material, a first layer 66a and a second layer 66b. Each layer includes thin sheet material, e.g., an organic polymer such as polyimide or benzo-cyclobutene (BCB), or an oxide insulating material like silicon dioxide (if such material can be provided in two layers). The double layered structure provides basic and supplemental insulation layers, or reinforced insulation in a single package. The two layers may be separable or non-separable. Each layer must be able to pass high voltage "type" testing at the required withstand voltage. If the layers are non-separable layers, the two-layer insulation will be tested at 200% required withstand voltage. If the layers are separable, then each layer of insulation can be tested at 100% required withstand voltage. In terms of material and/or thickness, the layers may be the same or different. For example, an insulating tape may be used for both layers according to one exemplary embodiment, as will be described below with reference to FIG. 5.

The lead frame, insulation structure and die assembly, exclusive of the external leads (signal pins 56a and current pins 54), is encapsulated in a plastic material 68. For purposes of illustration only, the package is shown as a 20 pin SOIC (with 10 pins being used as the primary current pins and 10 pins being used as the secondary signal pins). For simplification and clarity, the plastic material 68 has been omitted from the views of FIGS. 3B and 3C (as well as FIGS. 4B and 4C, described below).

It can be seen in the view shown in FIG. 3A that the package is fully integrated. The primary current will come in either the left or right five leads of the package and travel through the current conductor and out the other five leads. In this construction, from a top view (FIGS. 3A-3B), the double layer insulation structure has a semicircle shape, although the shape may vary with the shape of the underlying current conductor (lead frame).

As mentioned earlier, reinforced insulation requires that any path between primary and secondary conductors through a single layer of insulation must be a minimum of 0.4 mm. This 0.4 mm requirement applies to a single layer of insulation (that is not a thin sheet insulating layer, which does not have a minimum thickness requirement, as noted earlier), and the plastic molding compound of the package is considered a single layer of insulation. FIGS. 3B-3C show that the insulation structure 64 can be used to create a path of at least 0.4 mm from primary to secondary conductor through the molding plastic. This minimum 0.4 mm path is achieved by having the insulation structure 64 overhang the primary conductor by a minimum of 0.4 mm. This "overhang" dimension is indicated by reference numeral 70. As a result, there is no path from any point on the primary conductor to any secondary point, including the die, the solder plated copper pillars, or the signal leads through the plastic that is less than 0.4 mm.

In a second embodiment, and referring now to FIGS. 4A-4C, a die up assembly version of the current sensor shown as current sensor 50' can also be constructed to incorporate an insulation structure having certain features of insulation structure 64 illustrated in FIGS. 3A-3C, that is, the double layers of thin sheet insulation and the 0.4 mm of overhang (relative to the primary conductor). Like the current sensor 50 of FIGS. 3A-3C, the current sensor 50' is a current sensor in an SOIC package. FIGS. 4A-4B show a plan view and FIG. 4C a cross-sectional side view of a portion of the current sensor 50'. As can be seen in FIG. 4A, the current sensor 50' has a lead frame 52' with a first portion 52a' and a second portion 52*b*'. The first portion 52*a*' provides a current conductor with primary current leads or pins 54' and the second portion 52*b*' provides signal leads 56', external portions of those leads being indicated as corresponding signal leads or pins 56*a*'. Some of the primary current leads 54' are input current leads and the others are primary current output leads. The current sensor 50' includes a die 58' that contains a magnetic field sensing circuit or integrated circuit with magnetic field transducer 60 (and circuitry not shown). In the die up configuration of this implementation, contacts between the die 58' and the secondary signal leads 56*a*' are made with conventional semiconductor gold wire bonds 72. The die 58' is oriented face up, that is, a top or active surface 62 is face up. Disposed between the die 58' and the current conductor 52*a*' is an insulation structure 64'. Like the insulation structure 64 from FIG. 3A-3C, the insulation structure 64' is formed by two layers of insulating thin sheet material, a first layer 66*a*' and a second layer 66*b*'. In terms of material composition and/or thickness, the layers may be the same or different, as will be discussed in further detail with respect to FIG. 5. The lead frame, insulation structure and die assembly, exclusive of the external leads (signal pins 56*a*' and current pins 54), is encapsulated in a plastic molding compound 68'.

Like the insulation structure 64 from FIGS. 3A-3C, the insulation structure 64' is dimensioned to include an overhang portion that extends beyond the primary conductor 52*a*' and is used to create a path of at least 0.4 mm in distance from primary to secondary conductor through the molding plastic. Consequently, there is no path from any point on the primary conductor 52*a*' to any secondary point, including the die, the bond wires and the signal leads, through the plastic that is less than 0.4 mm.

The overall size and shape of the insulation structure varies with the size/shape of the underlying current conductor. One dimension that is critical is the 0.4 mm overhang dimension, the amount by which the structure extends beyond the current conductor. The amount of overhang may vary within certain practical limits, for example, a tolerance of +/−0.15 mm, to take into account any imperfections or inherent variability in manufacturing processes. The 0.4 mm dimension is a required minimum that includes all tolerances. Thus, the overhang may be larger but must be at least 0.4 mm after tolerancing. At minimum, the insulation structure 64 or 64' must be sized and shaped to cover at least that portion of the current conductor that lies underneath the die. In both of the illustrated constructions, that portion of the insulation structure has a semicircle shape. The curved periphery of the insulation structure extends beyond a corresponding curved periphery of the current conductor by at least the 0.4 mm (after tolerancing, as noted above). The curved portion of the semi-circular shape may be somewhat elongated to cover an additional portion of the current conductor that does not lie underneath the die, as shown in the illustrated examples, to ensure that the 0.4 mm requirement is adequately met.

The use of double layering of insulation between the die and current conductor in this design is key, since the performance of the IC current sensor is a function of the physical separation between the magnetic field generating source and magnetic field transducer. As mentioned earlier, the smaller the spacing between the die (more specifically, the magnetic field transducer) and the current conductor the more optimal the signal coupling will be. If a single layer of insulation were used in this region it would need to meet the 0.4 mm requirement, and a 0.4 mm distance separating the die from the current conductor would result in extremely poor signal coupling between current conductor and transducer. At the same time, the structure's shape/size with overhang portion guarantees compliance with the 0.4 mm requirement in areas of the package that rely only on a single layer of package body plastic for protective insulation. Thus, with one structure, dimensioned to have a thickness and composition designed to meet double insulation between some primary and secondary conductive parts or portions where close proximity between the two is important, and an area (size) that ensures that the distance through insulation between all other primary and secondary conductive parts or portions is at least 0.40 mm, construction requirements under the Standard for reinforced insulation are met.

For purposes of illustration only, the package is shown as a 20 pin SOIC (with 10 pins being used as the primary current pins and 10 pins being used as the secondary signal pins) in both flip chip and die up assemblies. The die size is shown as 3.7 mm by 1.9 mm for the flip chip design (FIG. 3B) and 1.9 mm by 1.9 mm for the die-up design (FIG. 4B). Other package sizes, with different pin counts, and different die sizes can be used.

One significant advantage of the flip chip design (FIGS. 3A-3C) is that the magnetic field transducer, which is located on the active surface of the die, is positioned much closer to the primary conductor. Bringing the transducer closer to the primary conductor increases the magnetic field signal coupling, thus providing higher signal to noise ratio as well as improved sensor resolution and accuracy. A disadvantage of the flip chip design is that the die size is larger and has a minimum size that is larger than that of the die-up design. The flip chip assembly requires that the die be large enough to line up with the secondary leads and also provide a minimum distance between the secondary contact to the die and the primary conductor. Increased die area increases die cost and therefore overall sensor cost. Also, a close inspection of FIGS. 3A-3B and FIGS. 4A-4B shows clearly that the primary conductor loop portion of the primary conductor is narrower (in terms of its width) in the flip chip design of FIGS. 3A-3C. A narrower primary conductor has more resistance and therefore more power dissipation inside the package for a given current. The die up design of FIGS. 4A-4C allows for the use of a much wider, and therefore lower resistance, primary conductor loop. The die up design also accommodates a larger overhang of the tape to provide a bit more safety margin, as 0.4 mm is a minimum requirement. Even a slight increase in this overhang will drastically improve the isolation characteristics of the package.

Figure 5:
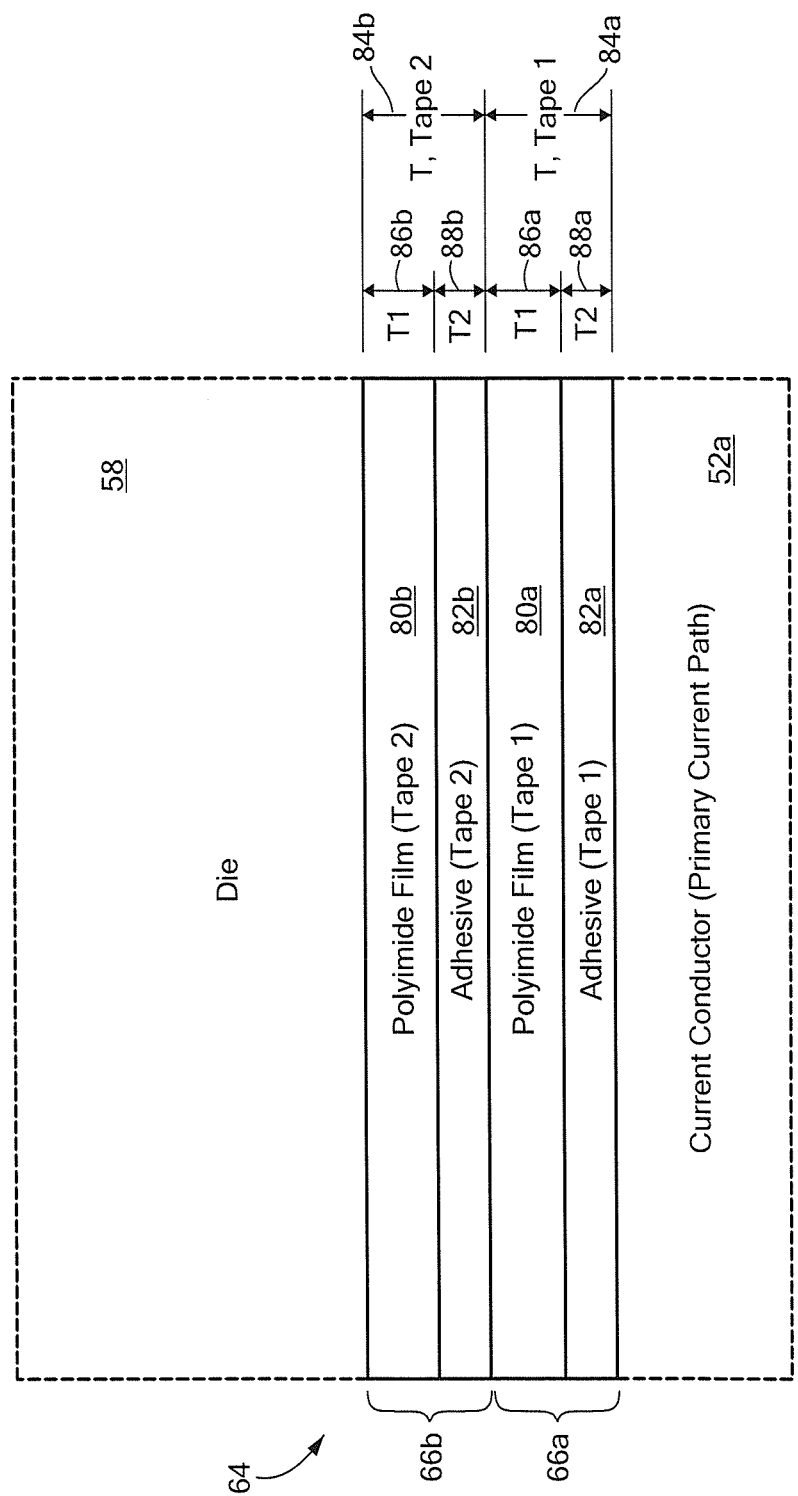
FIG. 5 shows a cross-section of the insulation structure of FIGS. 3A-3C and 4A-4C according to one exemplary embodiment.

FIG. 5 shows an enlarged, cross-sectional view of the insulation structure 64 (or 64') according to one exemplary embodiment. In this embodiment, each layer is provided as a tape layer. The first tape layer 66*a* (or 66*a*') includes a first polyimide film layer 80*a* and a first adhesive layer 82*a*. The second tape layer 66*b* (or 66*b*') includes a second polyimide film layer 80*b* and a second adhesive layer 82*b*. From bottom to top the order of the layers is adhesive layer 82*a* (which is in contact with the current conductor 52*a*), the polyimide film layer 80*a*, the adhesive layer 82*b* and the polyimide film layer 80*b*. The die 58 (or 58') is in contact with the polyimide film layer 80*b*. The first tape layer 66*a* has a thickness "T, tape 1" 84*a* and the second tape layer 66*b* has a thickness "T, Tape 2" 84*b*. The first polyimide film layer 80*a* has a thickness T1 86*a* and the second polyimide film layer 80*b* has a thickness T1 86*b*. The first adhesive layer 82*a* and the second adhesive layer 82*b* have thicknesses "T2" 88*a* and 88*b*, respectively. The thicknesses 84*a* and 84*b* of the tape layers may be the same (or substantially the same) or different. Likewise, the thickness of the adhesive layer and the polyimide film layer in one layer may be the same as or different from the corresponding layers in the other tape layer. For example, T1 86*a* may be less than T1 86b. The same type of tape may be used for both layers, in which case the composition and dimensions of the two layers will be the same (or substantially the same). Each layer can include only polyimide film.

One type of tape that may be used for each of the tape layers 66a, 66b is the R Series semiconductor adhesive tape available from Tomegawa Co., Ltd., of Japan. One of these tapes, marketed under the product number "R-740", has a polyimide layer thickness of 25 um and an adhesive layer thickness of 15 um. This tape provides a particularly high level of isolation per layer. It has an insulation property of approximately 330 KV per millimeter of thickness. Each layer of polyimide film is 25 microns and can therefore provide 330 KV*0.025 or 8.25 KV of isolation between the primary and the secondary conductors.

If tape is used as the thin sheet insulation layer, each layer may be applied separately, that is, the first layer applied to the top surface of the current conductor and the second layer applied to the first layer, or together (double layer of tape applied to the current conductor). In a flip chip assembly, the tape could be applied to the die before it is attached to the lead frame instead of being applied to the current conductor. Alternatively, in a non-tape implementation, each layer of thin sheet material may be deposited or otherwise formed on the top surface of the current conductor using conventional deposition processes such as spin coating or sputtering. Such processing would also need to coat the sides of the current conductor to form the overhang portion of the insulation.

In order for the current sensor to pass the Standard's testing for reinforced insulation and achieve a high working voltage rating of 500 VRMS, each single layer of tape (or other thin sheet) must survive 4800 VRMS for 60 seconds. This voltage is the required withstand voltage defined earlier. A 4800 VRMS signal has a peak voltage of approximately 6800 V. Each layer of insulation should survive this test. Thus, although each layer could be slightly thinner or thicker, it should be thick enough to survive 7 KV or better for high reliability. The use of double layers provides the supplemental insulation that will achieve the reinforced insulation rating, as mentioned above.

The plastic package material has insulation properties much lower than the thin sheet layer but still provides a good insulation barrier. The plastic package material is grouped into one of three categories under UL60950-1, material I, II and III. An insulating material is classified into a material group by its CTI (Comparative Tracking Index) test result. If the insulation material is not CTI tested, the UL60950-1 considers it to be a material group III material. Material group III is the lowest classification and results in the lowest working voltage rating. Accordingly, a material group II classified molding compound such as Sumitomo E670C, could be selected for use in the current sensor. Other molding compounds, e.g., Henkel MG-52F, if CTI tested to achieve material group II classification, might be suitable choices as well. The selection of a plastic classified as a material group II is important because the 500 VRMS working voltage rating may not be achievable in the design with material group III insulation material.

The 60 second high voltage isolation test (required withstand voltage) that the part must survive is called a type test. To achieve the working voltage rating of 500 VRMS, all of the current sensor devices should withstand 4800 VRMS for 60 seconds. Type testing is destructive in nature because applying 4800 VRMS to the package will exceed what is called the corona voltage, the voltage at which dendrites begin to grow, creating a failure path from primary to secondary conductive parts of the device. The Standard requires that a sample of three devices pass this type testing in order to become certified. The level at which the device passes will translate into a rated working voltage as mentioned earlier. In order to quality check all of the devices in production, the Standard requires a much shorter one second test at high voltage for package integrity. This test is called a routine test. The routine test is usually performed at 3000 VRMS for one second and all production units must be tested. The routine test is also a destructive test but its duration is short enough to not significantly degrade the package integrity.

Thus far the discussion of insulation has focused on the insulation properties inside of the package. Turning attention now to the outside of the package, creepage and clearance must also be considered when determining the working voltage of the current sensor. The term "clearance" refers to the shortest distance through air between two conductive parts, such as the primary and secondary leads. The term "creepage" refers to the shortest distance between two conductive parts along the surface of any insulation material common to both parts. The spacing distance between components that are required to withstand a given working voltage is specified in terms of creepage and clearance.

To obtain a high working voltage rating under the Standard, the SOIC package of the current sensor 50 or 50' must comply with the required minimum creepage and clearance distances for the desired working voltage specified in the Standard. The creepage requirements and clearance requirements are specified in Table 2N and Tables 2K-2M (of the Standard), respectively. Because the minimum clearance required for high working voltage ratings is less than the creepage requirement and therefore easier to meet, clearance will not be discussed in any detail. According to Table 2N, to achieve a rating for an RMS working voltage of 500 V for reinforced or double insulation using a material in material group II, a minimum creepage of 7.2 mm must be achieved. In determining whether the package meets this minimum, both package and package footprint on the PCB must be examined.

Figures 6A, 6B:
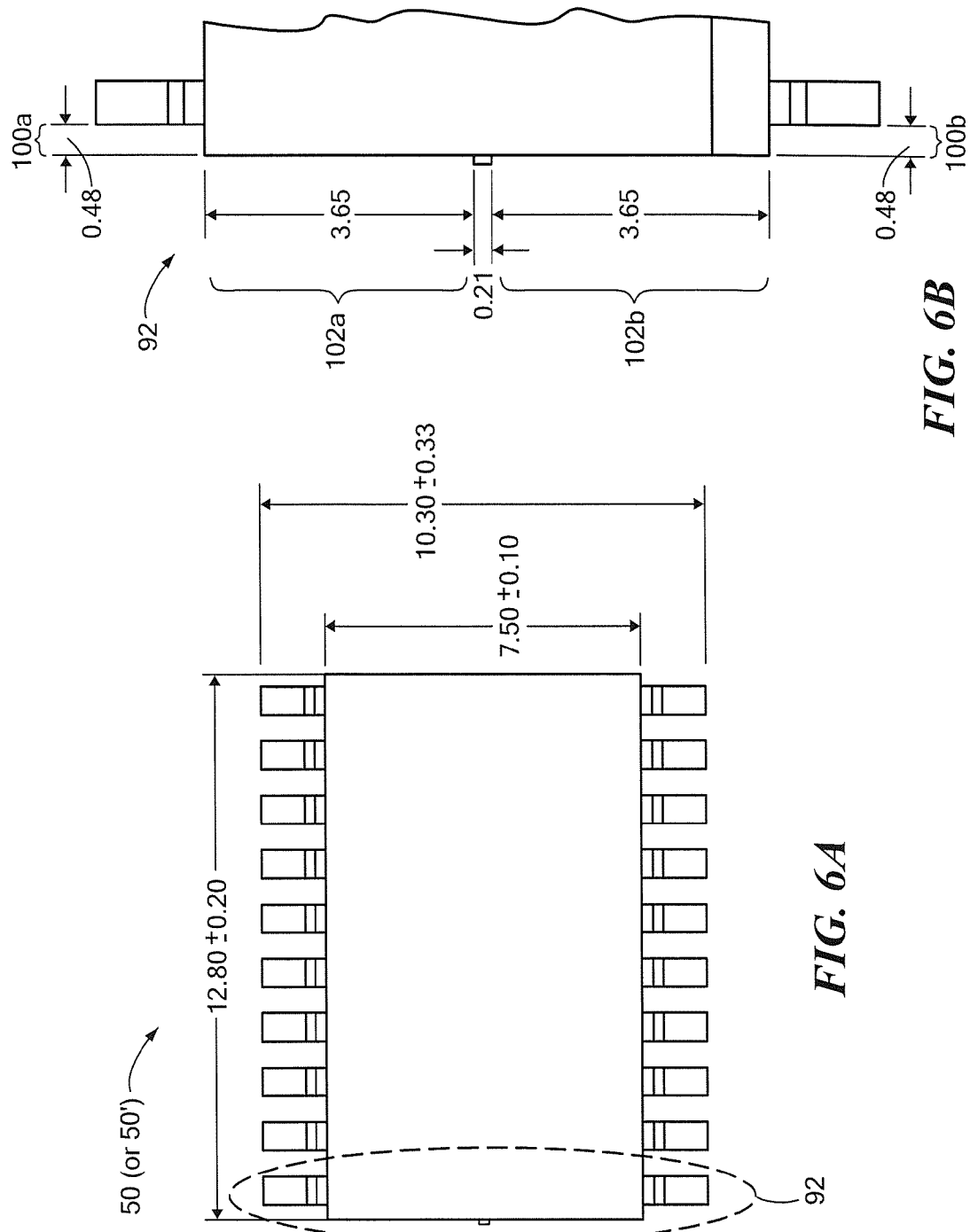
FIGS. 6A-6B show a plan view of the current sensor package (for the current sensor of FIGS. 3A-3C and 4A-4C), with dimensions pertaining to creepage and clearance.

FIGS. 6A-6B show a plan view of the current sensor 50 (or 50'). These views show only the outside of the current sensor's SOIC package (again illustrated as a 20 pin SOIC). In particular, the figures illustrate the physical limitations of this example SOIC package with respect to creepage. As shown in FIG. 6A, the illustrative package has a body length of 12.8 mm+/−0.20 mm and a width, lead tip to lead tip, of 10.30 mm+/−0.33 mm and a body width of 7.5 mm+/−0.10 mm. The body width (plastic body) is indicated by reference numeral 90. To determine the creepage distance, and referring to a portion of the package indicated by reference numeral 92, the entire distance along the plastic body (insulation) from the primary current pins to the second current pins needs to be determined. FIG. 6B shows an enlargement of portion 92. The creepage is determined by adding the dimensions of spaces 100a and 100b (shown in the figure as 0.48 mm) to body width determined as the sum of widths 102a and 102b (shown in the figure as 3.65 mm). Note that any burr protrusion (shown in the figure as being 0.21 mm wide) is excluded from the measurement. Thus, moving along the package from the primary to the secondary side yields a creepage of 8.26 mm. This is the highest number for creepage that this particular package can achieve. The package therefore easily meets the 7.2 mm minimum creepage required for a 500 VRMS working voltage.

Figure 7A:
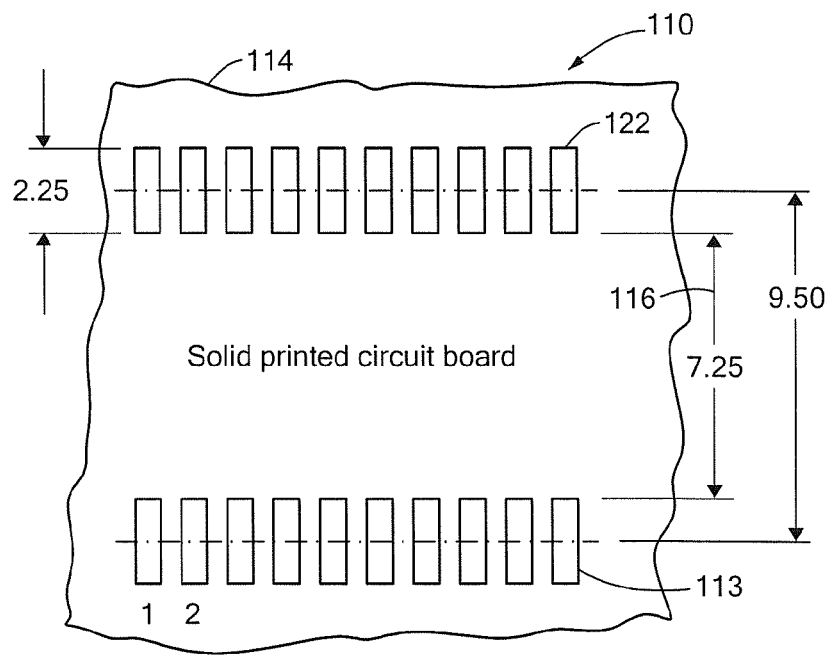
FIGS. 7A-7B show plan views of an example solid printed circuit board (PCB) layout (FIG. 7A) and a slotted PCB layout (FIG. 7B) for achieving different creepage specifications with the current sensor package depicted in FIGS. 6A and 6B.
Figure 7B:
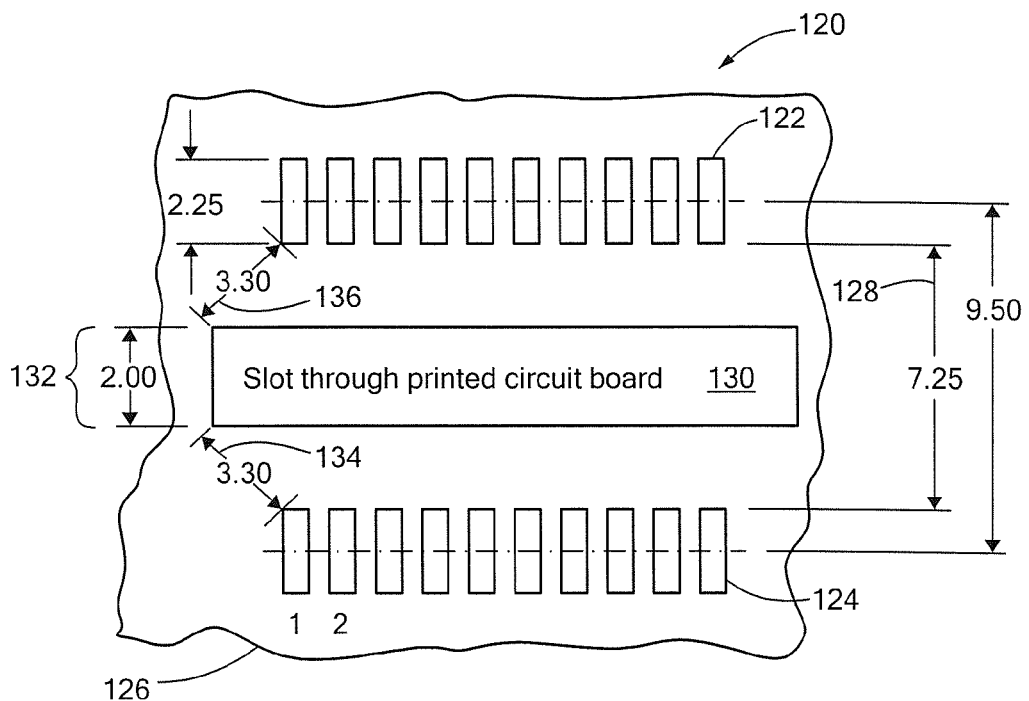

When the package is soldered to a PCB, the PCB solder pads will further decrease the creepage (and clearance). Referring to FIG. 7A, in a PCB mechanical layout 110 for the 20 pin SOIC illustrated in FIGS. 6A-6B, using standard solder pads 112 for secondary pins and 113 for primary pins on a portion of a solid PCB 114, yields a distance between the primary and secondary solder pads along the PCB of 7.25 mm. This distance between the solder pads 112 and 113 is the actual creepage for the package in the application. Although it is still greater than the required minimum of 7.2 mm, the margin of safety relative to the 7.2 mm minimum has been greatly reduced. The creepage can be improved somewhat by putting a slit in the PCB to improve the distance along the PCB from primary to secondary solder pads. Such a solution is shown in FIG. 7B, which shows a PCB mechanical layout 120 with solder pads 122 for secondary pins and solder pads 124 for primary pins, and a portion of a PCB 126 having a slot 130. The width of slot 130 is slot width 132. For this example, that width 132 is 2.00 mm. The distance from the primary side solder pads 124 to the slot 130 is distance or space 134. The distance from the secondary side solder pads 122 to the slot is distance or space 136. Both of these distances are 3.30 mm in this example. The total creepage in mm for the slotted PCB implementation is therefore (2×3.30)+2.00, or 8.60. This means that the creepage on the PCB can be improved to the maximum 8.26 mm value by using the slotted PCB. This approach will provide a significant safety margin on the 7.2 mm minimum value for 500 VRMS operation. If more creepage is required for an even higher working voltage rating with material group II molding compound, then a wider body package could be used. The PCB slot dimensions could also be adjusted to achieve improvements in creepage.

Figure 8:
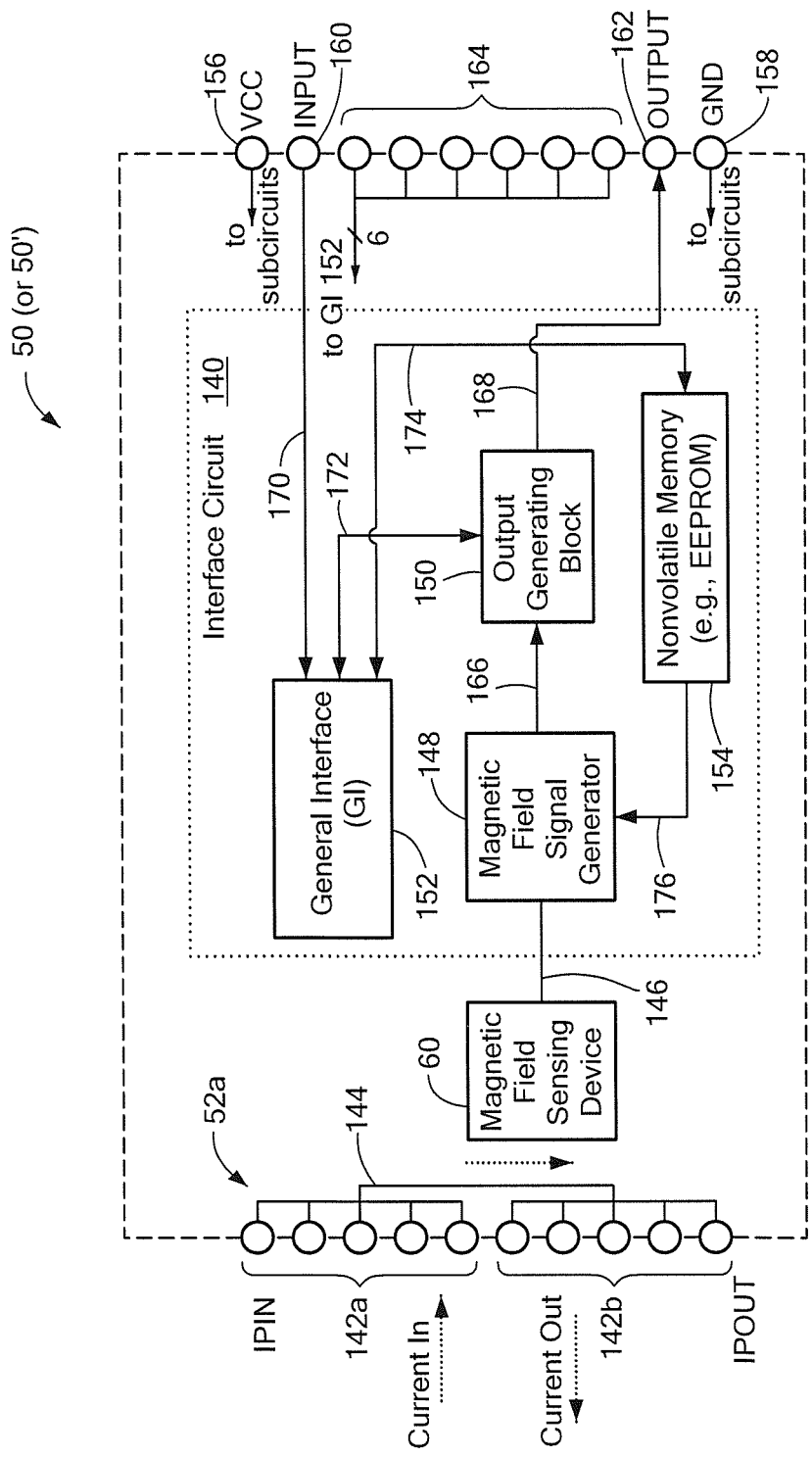
FIG. 8 shows a simplified, example functional block diagram for a current sensor of the type shown in FIGS. 3A-3C and FIGS. 4A-4C.

FIG. 8 shows a simplified, functional diagram of current sensor 50 (or 50') according to one example implementation. The current sensor 50 includes the magnetic field transducer 60 (from FIGS. 3A-3C, 4A-4C) shown as magnetic field sensing device 60. The magnetic field sensing device 60 may be formed by one or more sensing elements, such as Hall-effect or magnetoresistive (MR) sensing element. The sensing elements may be connected in a bridge circuit. The magnetic field sensing device 60 is coupled to an interface circuit 140. Together the magnetic field sensing device 60 and interface circuit 140 form the circuitry provided by the die 58 (FIG. 3A-3C), and referred to earlier as the magnetic field sensing circuit. The current sensor 50 also includes the internal or integrated current conductor 52a. In FIG. 8, the primary current leads (which were shown as primary current leads 54 in FIGS. 3A) are shown here as two groups of leads, a group of input pins, collectively shown as IPIN 142a and a group of output pins shown collectively as IPOUT 142b. This figure is intended as a functional block diagram and is not intended to depict the physical position of the current conductor 52a relative to the magnetic field transducer 60.

During operation, the current to be measured by the sensor 50 is applied to the conduction path 52a via the primary current leads or pins 142a, flows through a "loop" portion 144 of the path that carries the current near the magnetic field sensing device 60 and exits the current sensor 50 via the primary current output pins 142b. The applied current flowing through the conduction path 52a generates a magnetic field, which is sensed by the magnetic field sensor device 60 and converted to a proportional voltage at the device's output, output 146. The interface circuit 140 includes various blocks for conditioning and processing the output 146. For example, and as shown, the circuit 140 includes a magnetic field signal generator 148, an output generating block 150, an interface shown as general interface 152 and some type of nonvolatile memory 154, such as EEPROM.

In addition to the primary side leads 142a, 142b, the current sensor includes signal pins or terminals for connecting the current sensor to power, ground and external circuits that control and/or utilize the measurement capabilities of the current sensor, for example, an external micro-controller. These other signal pins, shown in FIGS. 3A-3C as secondary signal pins 56a, are shown here to include at least one pin (terminal or lead) to correspond to each of: a VCC terminal 156 (to connect to an external power supply), GND terminal 158 (to connect to ground), at least one input 160 and at least one output 162. The output would enable an external current sensor application such as a Ground Fault Interrupter (GFI) circuit or other current monitoring application to receive and make use of the information generated by the current sensor. Power is supplied to the current sensor 50 through the VCC pin 156, which is connected internally to the various subcircuits, as shown. The GND pin 158 is connected internally to provide a ground connection for subcircuits of the sensor. Other terminals or pins, collectively, pins 164, may correspond to inputs, for example, data inputs, clock signal and other control signals, such as programming control (to program the EEPROM, for example), as shown, or could also include other output pins or supply/ground lines. It will be appreciated that the functionality of the current sensor and the sensor's pinout can be varied to suit particular application needs.

The magnetic field signal generator 148, which is coupled to the magnetic field sensor device 60 and the output generating block 150, may contain various conventional circuits that operate collectively to generate a magnetic field signal generator output signal (or magnetic field signal) 166 from the sensing device's output 146. Generally, the circuit 148 includes at least an amplifier for amplifying the output signal of the sensing device 60. Other circuitry may be included in the magnetic field signal generator 148. For example, it may include circuitry to implement dynamic offset cancellation. If the sensing element is a Hall plate, a chopper stabilization circuit can be provided to minimize the offset voltage of the Hall plate and associated amplifier. Also, or alternatively, the circuit 148 may implement offset adjustment and/or a gain adjustment features.

In one simple implementation, the output generating block 150 can include a low-pass filter and output amplifier/buffer, which process the magnetic field signal 166 to produce an output signal 168. The output signal would be a value indicative of the sensed current's amplitude. To support processing functions and an even higher level of progammability, the output generating block 150 could be implemented to include a processor or microcontroller, or data signal processor. The microcontroller could be programmed to perform calculations and other tasks.

The general interface 152 receives at least one input on input line 170, which is connected to pin 160. It can also receive other inputs via the pins 164 when defined as input pins. These inputs can be used by external controllers or other application circuits to set or program user-defined internal parameters, e.g., compensation for gain and temperature, as well as provide input data and control information required by the operations of the general interface 152, output generating block 150 and/or the nonvolatile memory 154. The general interface 152 can be implemented to support different protocols, for example, serial communications protocols such as Inter-Integrated Circuit (I²C), Single-Edge Nibble Transmission (SENT), Peripheral Sensor Interface 5 (PSI5), Serial Peripheral Interface (SPI), or RS232. The general interface 152 is connected to the output generating block 150 and the nonvolatile memory 154 via interconnects or lines 172 and 174, respectively. The nonvolatile memory is coupled to the magnetic field signal generator 148 via connection 176. Connection 176 may be used to apply user-defined values, for example, gain adjustment, which have been stored on the nonvolatile memory 154, to circuitry of the magnetic field signal generator 148. Signal paths of the sensor IC can be implemented in the analog or the digital domain.

Although the illustrated device in FIGS. 3A-3C, 4A-4C, FIGS. 6A-6B, 7A-7B and FIG. 8 has twenty pins, other pin counts are possible, with some leads providing the primary current path and other leads providing connections for signals (e.g., output, power supply and ground). Also, it will be understood that additional functions beyond those shown in FIG. 8 can be included in the sensor IC as well.

Sensing elements that make up the magnetic field sensing device 60 can be made of Silicon, or a semiconductor material other than Silicon, such as Gallium Arsenide (GaAs) or an Indium compound, e.g., Indium Arsenide (InAs) or Indium Antimonide (InSb).

In sum, the current sensor 50 (or 50') has a design that is capability of achieving a reinforced rating, in particular, for high working voltages (for example, working voltages at least as high as 500 VRMS). The current sensor 50 (or 50') features an insulation structure with a unique construction that includes: a) a double layer of thin sheet material; and b) an overhang dimension that provides a minimum of 0.4 mm distance from primary to secondary components through the package plastic. Therefore, because of the construction of the insulation structure, the double thin sheet insulation and the plastic insulation of the package are compliant to reinforced insulation requirements of the Standard. Also, the package plastic is selected to be a material classified under the Standard as a group II material. Lastly, as discussed above with reference to FIGS. 6A-6B and 7A-7B, the current sensor can be packaged in an SOIC with dimensions and used with a PCB solder footprint to maintain at least a 7.2 mm creepage distance.

The current sensor and specific package will adhere to the requirements of construction according to the Standard in order to survive a high level of testing. It will provide a 3000 VRMS (minimum) level of galvanic isolation with double protection and working voltage up to 500 VRMS. The package will also maintain a distance through insulation material from primary to secondary that will allow it to pass a high voltage 4800 VRMS 60 second destructive test in order to achieve a 3000 VRMS galvanic (voltage) isolating rating. This testing is also required for a high working voltage rating and will allow the device to work at higher working voltages up to 500 VRMS.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A current sensor comprising:
   a lead frame having a first portion comprising current leads connected to form a current conductor to carry a primary current and a second portion comprising signal leads;
   a die, coupled to the second portion by an interconnect, comprising a magnetic field sensing circuit to sense a magnetic field associated with the primary current and produce an output based on the sensed magnetic field at one of the signal leads;
   an insulation structure disposed between the current conductor and the die, comprising a first insulation layer and a second insulation layer;
   plastic material surrounding the die, the interconnect and at least a portion of the lead frame to form a molded package body; and
   wherein the insulation structure is dimensioned so that the plastic material provides a reinforced insulation; and
   wherein the insulation structure covers at least a portion of the current conductor and extends beyond a periphery of the current conductor.

2. The current sensor of claim 1 wherein each of the first and second insulation layers comprises a polyimide film.

3. The current sensor of claim 2 wherein each of the first and second insulation layers further comprises a layer of adhesive.

4. The current sensor of claim 3 wherein the polyimide film and the adhesive layer are provided in a tape.

5. The current sensor of claim 4 wherein the tape has a thickness of approximately 40 microns.

6. The current sensor of claim 5 wherein the polyimide film has a thickness of approximately 25 microns.

7. The current sensor of claim 2 wherein the polyimide film has an insulating property and thickness that enables the polyimide film to withstand an isolation voltage of at least 7000 kV.

8. The current sensor of claim 1 wherein the first and second insulation layers are of substantially equal thickness.

9. The current sensor of claim 1 wherein the magnetic field sensing circuit comprises a magnetic field transducer having a sensing element selected from one of a Hall-effect sensing element or a magnetoresistive sensing element.

10. The current sensor of claim 1 wherein the coupling of the die to the second lead frame portion by the interconnect comprises a flip chip assembly.

11. The current sensor of claim 10 wherein the interconnect comprises solder plated copper pillars formed on a surface of the die.

12. The current sensor device of claim 1 wherein the coupling of the die to the second lead frame portion by the interconnect comprises a die-up assembly, wherein the interconnect comprises wire bonds.

13. The current sensor of claim 1 wherein the first and second insulation layers each have a thickness sufficient to meet a minimum working voltage rating of 500 VRMS.

14. The current sensor of claim 1 wherein the signal leads extend through the molded plastic material.

15. The current sensor of claim 1 wherein the package body is dimensioned to achieve a minimum creepage of 7.2 mm.

16. The current sensor of claim 1 wherein the first insulation layer is in contact with a top surface of the current conductor and the second insulation layer.

17. The current sensor of claim 1 wherein the current conductor has a curved periphery portion and the insulation structure has a substantially semicircular shape with a curved portion that extends laterally beyond the curved periphery portion of the current conductor by an overhang dimension of a minimum of 0.4 mm including all tolerances.

18. The current sensor of claim 17 wherein the first and second insulation layers each comprises a tape that includes a polyimide film layer and an adhesive layer.

19. The current sensor of claim 18 wherein the polyimide film layer has a thickness of at least 25 microns.

20. The current sensor of claim 1 wherein a distance between the current conductor and any one of the signal leads is at least 0.4 mm.

21. The current sensor of claim 20 wherein a path around the insulation structure from the die to the current conductor portion of the lead frame is at least 0.4 mm in distance.

* * * * *

UNITED STATES PATENT AND TRADEMARK OFFICE
CERTIFICATE OF CORRECTION

| | | |
|---|---|---|
| PATENT NO. | : 8,907,437 B2 | Page 1 of 1 |
| APPLICATION NO. | : 13/188739 | |
| DATED | : December 9, 2014 | |
| INVENTOR(S) | : Shaun D. Milano et al. | |

It is certified that error appears in the above-identified patent and that said Letters Patent is hereby corrected as shown below:

In the specification

Column 11, Line 24, delete "may deposited" and replace with --may be deposited--.

Column 15, Line 17, delete "capability" and replace with --capable--.

Signed and Sealed this
Twenty-second Day of March, 2016

Michelle K. Lee
*Director of the United States Patent and Trademark Office*